United States Patent
Shida

(10) Patent No.: US 9,824,623 B2
(45) Date of Patent: Nov. 21, 2017

(54) METHOD FOR DRIVING ORGANIC ELECTROLUMINESCENT ELEMENT

(71) Applicant: Konica Minolta, Inc., Tokyo (JP)

(72) Inventor: Kuniaki Shida, Tokyo (JP)

(73) Assignee: Konica Minolta, Inc., Tokyo (JP)

(*) Notice: Subject to any disclaimer, the term of this patent is extended or adjusted under 35 U.S.C. 154(b) by 0 days.

(21) Appl. No.: 14/897,245

(22) PCT Filed: Jun. 11, 2014

(86) PCT No.: PCT/JP2014/065510
§ 371 (c)(1),
(2) Date: Dec. 10, 2015

(87) PCT Pub. No.: WO2014/200034
PCT Pub. Date: Dec. 18, 2014

(65) Prior Publication Data
US 2016/0133180 A1    May 12, 2016

(30) Foreign Application Priority Data

Jun. 13, 2013  (JP) .................... 2013-124957

(51) Int. Cl.
*G09G 3/30*    (2006.01)
*H01L 51/00*   (2006.01)
(Continued)

(52) U.S. Cl.
CPC ............ *G09G 3/30* (2013.01); *G09G 3/2003* (2013.01); *G09G 3/32* (2013.01); *H01L 51/0031* (2013.01); *H05B 33/0896* (2013.01); *G09G 2310/06* (2013.01); *G09G 2320/045* (2013.01); *G09G 2320/0626* (2013.01);
(Continued)

(58) Field of Classification Search
None
See application file for complete search history.

(56) References Cited

U.S. PATENT DOCUMENTS

2006/0114190 A1   6/2006  Fang et al.
2012/0104367 A1   5/2012  Hasegawa et al.
2012/0248424 A1*  10/2012 Sasaki ................... H01L 51/504
                                                                257/40

FOREIGN PATENT DOCUMENTS

JP   2001-282160 A   10/2001
JP   2003-066868 A    3/2003
(Continued)

OTHER PUBLICATIONS

International Search Report issued in corresponding application No. PCT/JP2014/065510 mailed Sep. 2, 2014 (4 pages).
(Continued)

*Primary Examiner* — Kenneth B Lee, Jr.
(74) *Attorney, Agent, or Firm* — Osha Liang LLP

(57) ABSTRACT

A method for driving an organic electroluminescent element including a first light-emitting layer and a second light-emitting layer comprises: applying a second current peak value to the second light-emitting layer exhibits a lower luminous efficiency than the first light-emitting layer at a current density of the second current peak value; and applying a first current peak value to the first light-emitting layer, wherein the first current peak value has a higher current density than the second current peak value.

7 Claims, 3 Drawing Sheets

(51) Int. Cl.
    *H05B 33/08*     (2006.01)
    *G09G 3/20*     (2006.01)
    *G09G 3/32*     (2016.01)
    *H01L 27/32*     (2006.01)

(52) U.S. Cl.
    CPC . *G09G 2320/0666* (2013.01); *G09G 2330/04* (2013.01); *H01L 27/3209* (2013.01)

(56) References Cited

FOREIGN PATENT DOCUMENTS

| | | |
|---|---|---|
| JP | 2003-234181 A | 8/2003 |
| JP | 2008-503055 A | 1/2008 |
| JP | 2010-039241 A | 2/2010 |
| JP | 2013-089302 A | 5/2013 |
| KR | 2012/0088714 A | 8/2012 |
| WO | 2005/106835 A1 | 11/2005 |

OTHER PUBLICATIONS

Office Action issued in corresponding Korean Application No. 10-2015-7034958 dated Nov. 15, 2016, and English translation thereof (9 pages).
Extended European Search Report issued in corresponding European Application No. 14810425.0 dated Dec. 13, 2016 (7 pages).
Office Action issued in corresponding Korean Application No. 10-2015-7034958 dated Aug. 17, 2017 (9 pages).

\* cited by examiner

METHOD FOR DRIVING ORGANIC ELECTROLUMINESCENT ELEMENT

TECHNICAL FIELD

The present invention relates to a method for driving an organic electroluminescent element.

BACKGROUND ART

An organic electroluminescent element (organic EL element) has advantages such as a smaller view-angle dependency, a higher contrast ratio, and higher possibility of film thinning than a crystal display device.

In addition, recently, a potable display, a potable back display and the like each utilizing the organic EL element are also positively put on the market. These displays and the like each utilizing the organic EL element are expected to be put on the large TV market due to its high visibility, and the market introduction as a flat panel display is accelerated due to a media report or the like of the introduction plan.

In addition, since the organic EL element is a self-light-emitting type light source and is a plane light-emitting light source, the element is highlighted as next-generation lighting, and then intensive developments as organic EL lighting have been done in various places.

The organic EL element has light-emitting materials of RGB in between electrodes, and luminescent color and the intensity of luminescent color can be freely changed by optionally controlling and driving an output of each light emission of RGB, or by conducting the layer design including thicknesses of organic layers. Therefore, the organic EL element can emit freely the white color light required as lighting application, for example, from a bulb color of a color temperature of 2000 K, 3000 K or the like to a daylight white color light of 5000 K, 6000 K or the like. Furthermore, the element can realize the luminous efficiency equal to or more than the LED and the fluorescent lamp by using a phosphorescent material, and thus is expected to be realized as thin lighting.

In addition, the colors can be varied to a plurality of colors in the case of a display, and thus, for example, lighting and a light source which can change its color have also been proposed by forming the RGB light-emitting layers in the form of strip in the horizontal direction, and by changing the intensity ratio of each luminescent color (for example, see Patent Literature 1).

Furthermore, it has been also proposed that the toning is carried out by stacking the light-emitting layers in the vertical direction to a transparent substrate to thereby increase its aperture ratio (refer to, for example, Patent Literature 2).

CITATION LIST

Patent Literature

PTL 1: Japanese Patent Laid-Open No. 2003-066868
PTL 2: Japanese Translation of PCT International Application Publication No. 2008-503055

However, in the organic electroluminescent element having a plurality of light-emitting layers, lifetimes (deterioration rates) of the respective light-emitting layers are different from each other. Therefore, the color tone of luminescent color of the organic electroluminescent element is changed from the initial color tone with the lapse of time. As a result, the display quality of the organic electroluminescent element becomes lowered with the lapse of time.

In view of the above, a method for driving the organic electroluminescent element capable of suppressing the reduction in the display quality has been demanded.

SUMMARY

One or more embodiments of the present invention are methods for driving an organic electroluminescent element including a first light-emitting layer and a second light-emitting layer. The method includes applying a first current peak value to the first light-emitting layer and applying a second current peak value to a second light-emitting layer. In the method, the second light-emitting layer exhibits a lower luminous efficiency than the first light-emitting layer, at a current density of the second current peak value. In the method, the second current peak value has a lower current density than the first current peak value.

According to one or more embodiments of the present invention, the first current peak value having a high current density is applied to the first light-emitting layer having high luminous efficiency, and the second current peak value having a low current density is applied to the second light-emitting layer having low luminous efficiency. Thereby, the reduction in luminance of the first light-emitting layer can be accelerated, and the reduction in luminance of the second light-emitting layer can be suppressed. Therefore, the difference of the reduction in luminance among the light-emitting layers, which is generated with the lapse of time can be suppressed, and thus the change in color tone of the organic electroluminescent element can be suppressed. Accordingly, the reduction in the display quality of the organic electroluminescent element can be suppressed.

According to one or more embodiments of the present invention, a method for driving the organic electroluminescent element capable of suppressing the reduction in the display quality can be provided.

DESCRIPTION OF EMBODIMENTS

Hereinafter, one or more embodiments of the present invention will be explained, but the present invention is not limited to the following examples.

Note that the explanation will be done in the following order.

1. Summary
2. Method for driving Organic Electroluminescent according to one or more embodiments of the present invention

1. Summary

Before explaining the embodiments of the present invention, a summary of the method for driving the organic electroluminescent element (organic EL element) will be explained.

Figure 1:
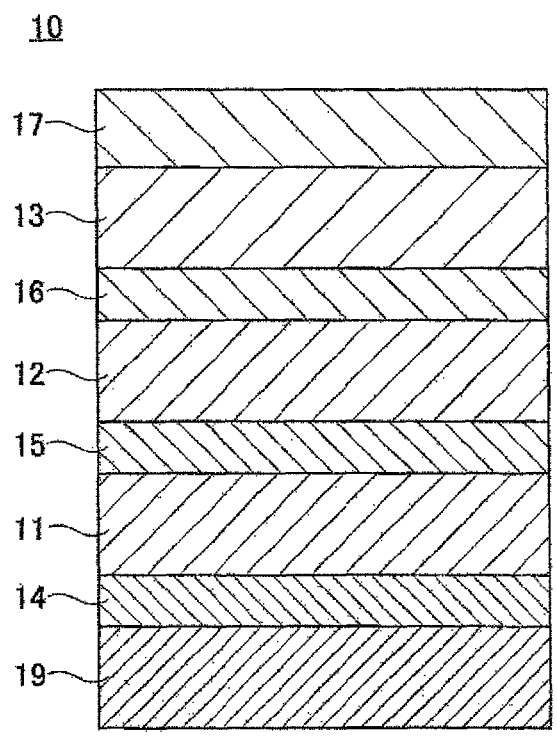
FIG. 1 shows a configuration of an organic EL element according to one or more embodiments of the present invention.

FIG. 1 shows the example of configuration of the organic EL element to which the driving method is applied.

The organic EL element 10 shown in FIG. 1 has the configuration in which a first electrode 14, a first light-emitting functional layer 11, a second electrode 15, a second light-emitting functional layer 12, a third electrode 16, a third light-emitting functional layer 13 and a fourth electrode 17 are laminated on a substrate 19 in this order.

In one or more embodiments, the first light-emitting functional layer 11 has a light-emitting layer which emits green (G) light, the second light-emitting functional layer 12 has a light-emitting layer which emits red (R) light, and the third light-emitting functional layer 13 has a light-emitting layer which emits blue (B) light. In addition, a phosphorescent material is used for the green light-emitting layer and the red light-emitting layer of the first light-emitting functional layer 11 and the second light-emitting functional layer 12, and a fluorescent material is used for the blue light-emitting layer of the third light-emitting functional layer 13.

The organic EL element 10 is formed to have an outer dimension of 40 mm×40 mm.

The first electrode 14 is formed of an ITO with 300 nm, the second electrode 15 is formed of an Al with 15 nm, the third electrode 16 is formed of an Al with 15 nm, and the fourth electrode 17 is formed of an Al with 100 nm.

Furthermore, the first light-emitting functional layer 11 is formed of $MoO_3$ having a thickness of 30 nm as a positive hole injection layer; α-NPD having a thickness of 50 nm as a positive hole transport layer; a host material for luminescence and a phosphorescent material that emits green light and that has a concentration of 3 to 5%, as a light-emitting layer; Alq3 having a thickness of 30 nm as an electron transport layer for a light-emitting dopant; and LiF having a thickness of 1 nm as an electron injection layer, on the first electrode 14.

The second light-emitting functional layer 12 is formed of a positive hole injection layer of $MoO_3$ having a thickness of 30 nm, a positive hole transport layer of α-NPD having a thickness of 50 nm, a light-emitting layer of a host material for luminescence and a phosphorescent material that emits red light and that has a concentration of 3 to 5%, an electron transport layer for a light-emitting dopant of Alq3 having a thickness of 30 nm, and an electron injection layer of LiF having a thickness of 1 nm, on the second electrode 15.

The third light-emitting functional layer 13 is formed of a positive hole injection layer of $MoO_3$ having a thickness of 30 nm, a positive hole transport layer of α-NPD having a thickness of 50 nm, a light-emitting layer of a host material for luminescence and a fluorescent material that emits blue light and that has a concentration of 3 to 5%, an electron transport layer for a light-emitting dopant of Alq3 having a thickness of 30 nm, and an electron injection layer of LiF having a thickness of 1 nm, on the third electrode 16.

Figure 2:
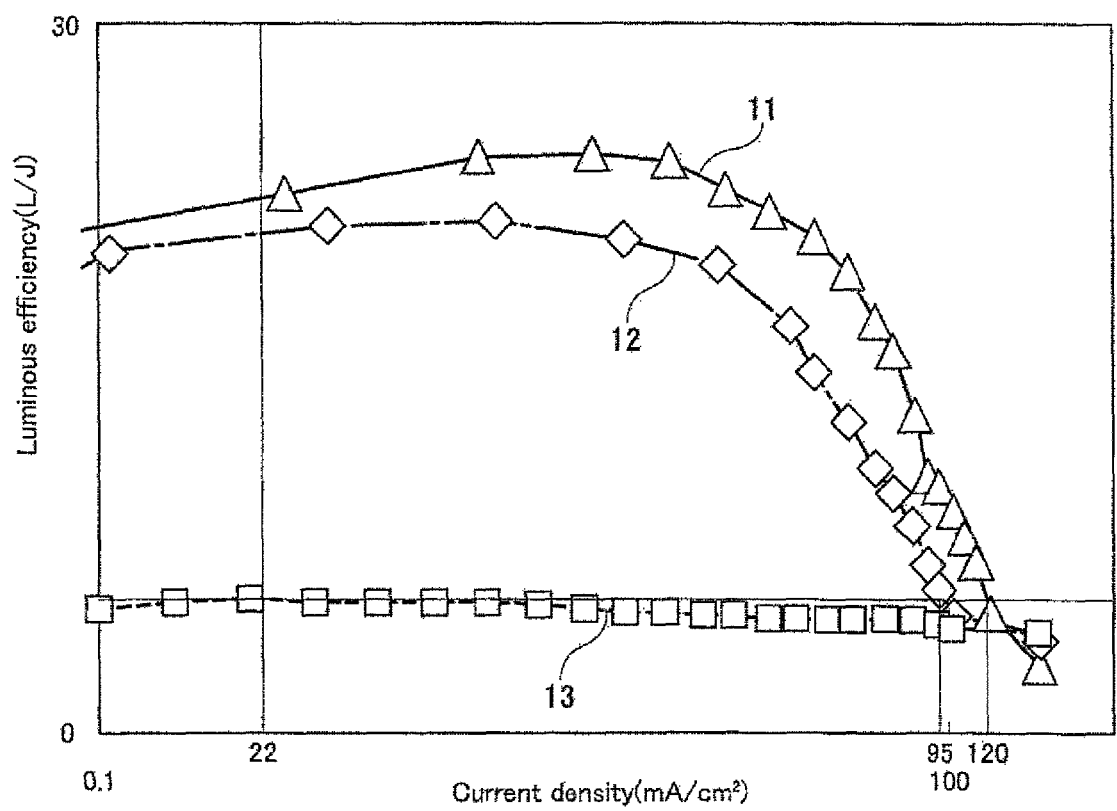
FIG. 2 shows characteristics of efficiency of the organic EL element shown in FIG. 1.

FIG. 2 shows characteristics of efficiency of each light-emitting functional layer of the organic EL element having the above configuration.

In the characteristics of efficiency shown in FIG. 2, the vertical axis represents the luminous efficiency of each of the first light-emitting functional layer 11, the second light-emitting functional layer 12, and the third light-emitting functional layer 13, and the horizontal axis represents a current density to be applied.

As shown in FIG. 2, the luminous efficiency is largely different depending to each of the light-emitting functional layers. Particularly, the first light-emitting functional layer 11 and the second light-emitting functional layer 12 which are formed of the phosphorescent material has a higher luminous efficiency at a low current density than that in the third light-emitting functional layer 13 which is formed of the fluorescent material.

Furthermore, with respect to the first light-emitting functional layer 11 and the second light-emitting functional layer 12 which are formed of the phosphorescent material, the luminous efficiency is largely decreased in comparison with the third light-emitting functional layer 13, by the increase in the current density. In addition, at a certain current density, the luminous efficiency is lowered to not more than the luminous efficiency of the third light-emitting functional layer 13 which is constituted of the fluorescent material.

Figure 3:
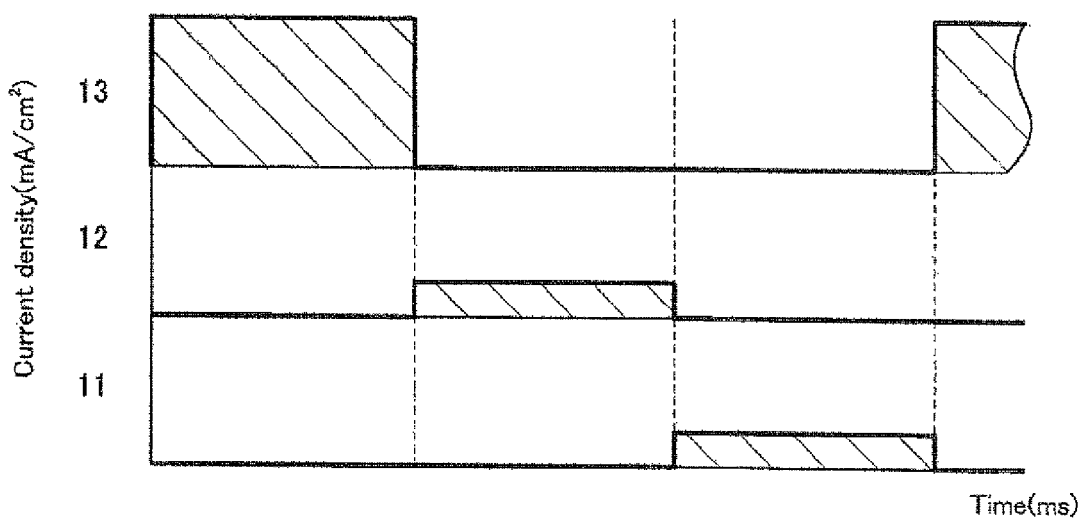
FIG. 3 shows a driving waveform when using the conventional method for driving the organic EL element.

Next, FIG. 3 shows a drive waveform when a usual conventional method for driving is used.

In the drive waveform shown in FIG. 3, the vertical axis represents a current density to be applied and the horizontal axis represents a period of time to be applied, with respect to each of the first light-emitting functional layer 11, the second light-emitting functional layer 12, and the third light-emitting functional layer 13.

As shown in FIG. 3, the period of time to be applied to each light-emitting functional layer is the same according to the usual conventional driving method. Namely, the period of time to be applied to each light-emitting functional layer is ⅓ duty of a frame frequency 100 Hz. Each of RGB has an independent light emission of 3.3 msec.

In the usual conventional driving method, when performing a display of white color 1,000 cd/m² with CIE chromaticity of <0.3, 0.3> on the organic EL element 10 having the above configuration, the current peak value of each color used at this time is 3.8 mA/m² for the green light-emitting layer, 4.2 mA/m² for the red light-emitting layer, and 22 mA/cm² for the blue light-emitting layer.

Furthermore, in the usual conventional driving method, the organic EL element 10 having the above configuration has luminous efficiencies of about 4.9 cd/A in the blue color, about 21 cd/A in the red color, and about 25 cd/A in the green color.

Figure 4:
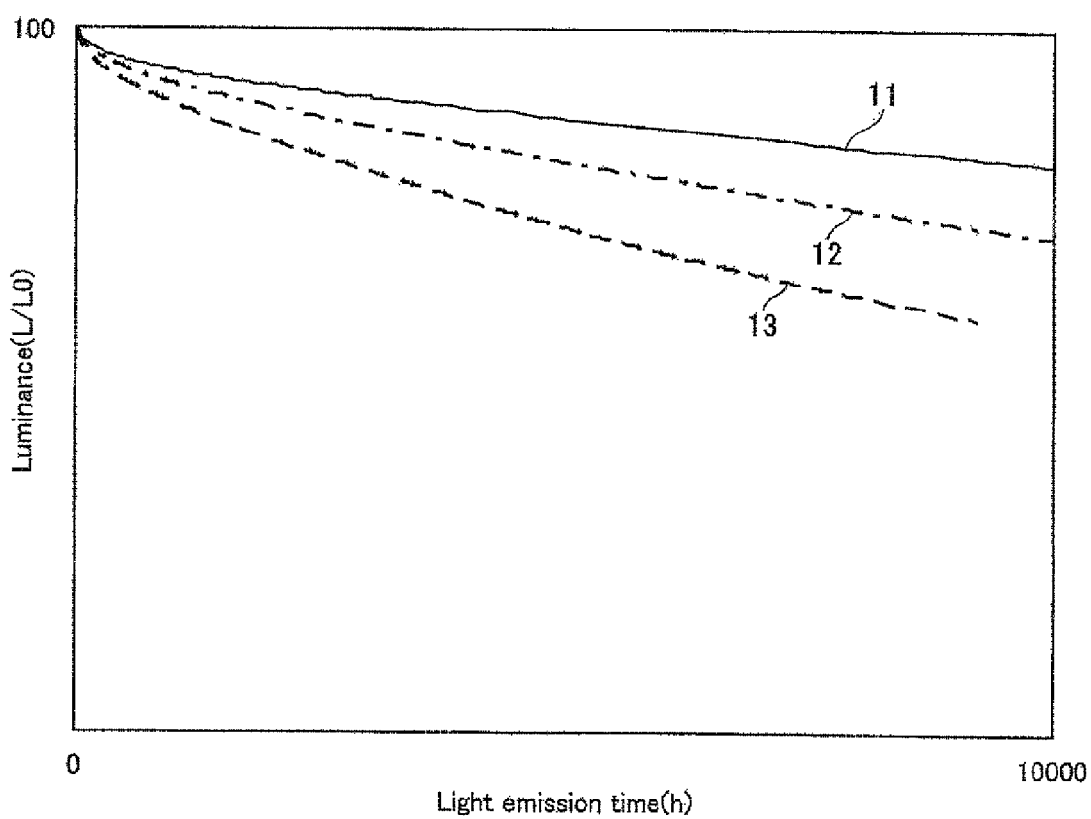
FIG. 4 shows characteristics of lifetime deterioration when using the conventional method for driving the organic EL element.

In the organic EL element, the luminance of each light-emitting functional layer is lowered with the lapse of light emission time. FIG. 4 shows characteristics of lifetime deterioration exhibiting reduction in luminance of each light-emitting functional layer with the lapse of time.

As shown in FIG. 4, when using the usual conventional driving method, each light-emitting functional layer exhibits different reduction in luminance with the lapse of driving time of the organic EL element. In the above organic EL element 10, the reduction in luminance of the third light-emitting functional layer 13 using the fluorescent material having low luminous efficiency is large, and the reduction in luminance of the first light-emitting functional layer 11 using the phosphorescent material having high luminous efficiency is small. Namely, the lifetime of the third light-emitting functional layer 13 is short, and the lifetime of the first light-emitting functional layer 11 is long.

As shown in FIG. 4, with respect to the organic EL element having different characteristics of lifetime deterioration of each color, the luminescent color changes from the initially set color tone with the lapse of time. Particularly, the emission luminance of a blue color having a large reduction in luminance is lowered, and thus the color tone changes from the initially set color tone to the color tone in which the blue light is lowered, for example, from the initially set white color tone to the yellowish color tone. In this way, according to the conventional driving method, the emission color of the organic EL element changes with the lapse of time to thereby lower the display quality.

The above reduction in luminance of the light-emitting layer corresponds to the luminous efficiency shown in FIG. 2. Namely, in the third light-emitting functional layer 13 using the fluorescent material having low luminous efficiency, in order to compensate for the low luminous efficiency, driving at a high current density of 22 mA./cm$^2$ in the blue light-emitting layer becomes necessary. In contrast, in the first light-emitting functional layer 11 using the phosphorescent material having high luminous efficiency, driving at a low current density of 3.8 mA/m$^2$ becomes possible.

The lifetime of the element is different depending on the current density to be applied, and the lifetime of the element becomes shorter when driving at a high current peak value, and the lifetime of the element tends to become shorter in the case of driving at a low current peak value. Namely, in the above organic EL element 10, since the luminous efficiency is as low as about 4.9 cd/A, and the element is driven at a high current density of 22 mA/cm$^2$, the blue light-emitting layer has a large reduction in luminance. In addition, since the luminous efficiency is as high as about 25 cd/A, and the element is driven at a low current density of 3.8 mA/m$^2$, the green light-emitting layer has a small reduction in luminance.

As described above, according to the conventional driving method, a high current peak value is applied to a light-emitting layer having low luminous efficiency, and a low current peak value is applied to a light-emitting layer having high luminous efficiency. As a result, the characteristics of the lifetime deterioration of the respective light-emitting functional layers are different from one another, resulting in changing the emission colors with the lapse of time.

Furthermore, in the organic EL element having the light-emitting functional layers with different luminous efficiencies, as a method for making the lifetimes of the respective light-emitting functional layers coincident with each other, there is, for example, a method for forming an element by changing areas of light emission or aperture ratios of each color in forming in parallel the light-emitting functional layers by an RGB selective coating method. The method is generally and widely employed in, particularly, the organic EL display field, and the like.

However, according to the method, when displaying only the green light-emitting layer having high luminous efficiency, a non-lighting area is viewed, and the method is not appropriate as a lighting source to be viewed such as an organic EL lighting device for decoration.

Therefore, according to one or more embodiments of the present invention, contrary to the above conventional driving method, a low current peak value is applied to a light-emitting layer having low luminous efficiency, and a high current peak value is applied to a light-emitting layer having high luminous efficiency. The difference generated in the characteristics of lifetime deterioration of each light-emitting functional layer is suppressed by employing the driving method. Namely, it is possible to bring close the lowering rates of luminance of the light-emitting functional layers with the lapse of time and to suppress the change of color tone with the lapse of time.

2. Method for Driving Organic Electroluminescent Element According to One or More Embodiments of the Present Invention A method for driving the organic electroluminescent element (organic EL element) according to one or more embodiments of the present invention will be explained. Note that, in one or more embodiments, explanation will be done according to the method for driving the organic EL element having the same configuration as that shown in FIG. 1, used in the summary described above. The luminous efficiency of each of the light-emitting functional layers of the organic EL element is also the same as in the above FIG. 2.

Figure 5:
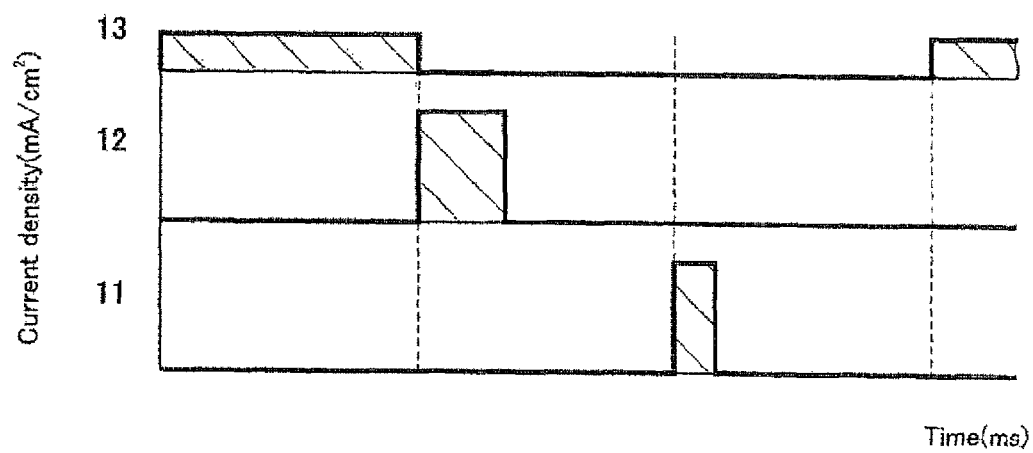
FIG. 5 shows the driving waveform when using the method for driving the organic EL element according to one or more embodiments of the present invention.

The driving waveform according to the driving method of one or more embodiments of the present invention is shown in FIG. 5.

As shown in FIG. 5, according to the driving method of one or more embodiments of the present invention, the current density to be applied to the first light-emitting functional layer 11 emitting green light, using the phosphorescent material having high luminous efficiency, is the highest, and the current density to be applied to the third light-emitting functional layer 13 emitting blue light, using the fluorescent material having low luminous efficiency, is the lowest. In the second light-emitting functional layer 12 in which the luminous efficiency is present between the high luminous efficiency and the low luminous efficiency, the current density to be applied is set between the current densities to be applied of the first light-emitting functional layer 11 and the third light-emitting functional layer 13.

As described above, the characteristics of the lifetime deterioration of the respective light-emitting functional layers can make coincident with each other by controlling the current density to be applied. Specifically, a low current peak value is applied to a light-emitting layer having a relatively low luminous efficiency, and a high current peak value is applied to a light-emitting layer having a relatively high luminous efficiency.

The current peak value to be applied to each of the light-emitting functional layers can be set in the following way.

The current peak value to be applied can be derived from the relation of the current density and the luminous efficiency shown in FIG. 2. For example, the current peak values to be applied to the first light-emitting functional layer 11 and the second light-emitting functional layer 12 are determined in accordance with the third light-emitting functional layer 13 having the lowest luminous efficiency.

First, the current peak value to be applied to the third light-emitting functional layer 13 is determined. In the example shown in FIG. 2, the current peak value to be applied to the third light-emitting functional layer 13 is a current peak value which is set smaller than the current density in which luminous efficiency of the third light-emitting functional layer 13 becomes the same as the luminous efficiency of the first light-emitting functional layer 11. Besides, the current peak value is set smaller than the current density in which the luminous efficiency of the third light-emitting functional layer 13 becomes the same as the luminous efficiency of the second light-emitting functional layer 12.

Namely, the current peak value to be applied to the third light-emitting functional layer 13 is determined at the position where the current density is lower than the position where each of the curved line of the first light-emitting functional layer 11 and the curved line of the second light-emitting functional layer 12 intersects with the curved line of the third light-emitting functional layer 13, in FIG. 2. For example, according to one or more embodiments of the present invention, the current density to be applied to the third light-emitting functional layer 13 is 22 mA/cm$^2$.

The luminous efficiency of the third light-emitting functional layer 13 can be determined by determination of the current density to be applied to the third light-emitting functional layer 13.

Next, in the first light-emitting functional layer 11, the current density is obtained so that the luminous efficiency is the same as the luminous efficiency determined as described above of the third light-emitting functional layer 13. Then, a current peak value which is not less than the thus obtained current density is set as the current peak value to be applied to the first light-emitting functional layer 11. For example, according to one or more embodiments of the present invention, the current density to be applied to the first light-emitting functional layer 11 becomes 120 mA/cm$^2$.

In the same way, in the second light-emitting functional layer 12, the current density is obtained so that the luminous efficiency is the same as the luminous efficiency determined as described above of the third light-emitting functional layer 13. Then, a current peak value which is not less than the thus obtained current density is set as the current peak value to be applied to the second light-emitting functional layer 12. For example, according to one or more embodiments of the present invention, the current density to be applied to the second light-emitting functional layer 12 is 95 mA/cm$^2$.

Figure 6:
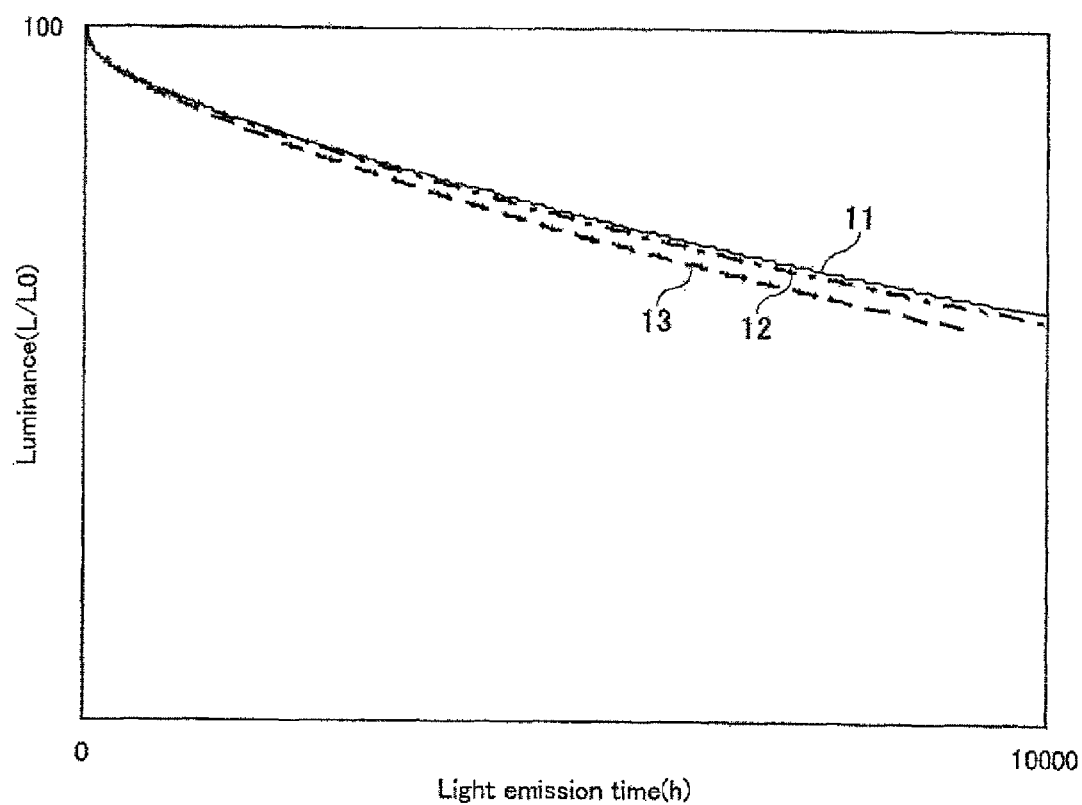
FIG. 6 shows the characteristics of lifetime deterioration when using the method for driving the organic EL element according to one or more embodiments of the present invention.

FIG. 6 shows the characteristics of the lifetime deterioration which represents the reduction in luminance of the organic EL element with the lapse of time when using the above current peak value.

As shown in FIG. 6, the characteristics of the lifetime deterioration of each light-emitting functional layer of the organic EL element can be improved by controlling the current density on the basis of the luminous efficiency.

Namely, the reduction in luminance of the light-emitting functional layer having low luminous efficiency is moderated by applying a current peak value which is lower than the other light-emitting functional layer to the light-emitting functional layer having low luminous efficiency, and thus the lifetime of the layer is elongated. Furthermore, in the current density which is applied to the light-emitting functional layer having low luminous efficiency, the reduction of luminance is accelerated by applying a current peak value which is higher than the current density applied to the light-emitting functional layer having low luminous efficiency, to the light-emitting functional layer having high luminous efficiency.

As a result, the characteristics of the lifetime deterioration of the respective light-emitting functional layers transition in the direction where the characteristics coincide with one another.

In addition, toning of the organic EL element can be carried out by controlling the driving time of each of the light-emitting functional layers.

According to the method explained in the above summary, the toning of the organic EL element is carried out by controlling the current density to be applied to the light-emitting layer. In one or more embodiments of the present invention, since the current density to be applied to the light-emitting functional layer is determined by the luminous efficiency and the characteristics of the lifetime deterioration, it is difficult to carry out the toning by adjustment of the current density to be applied. Therefore, the toning of the organic EL element is carried out by controlling the light emission time of each of the light-emitting functional layers.

As described above, when applying a high current peak value to the first light-emitting functional layer 11, the luminance of the first light-emitting functional layer 11 becomes high. Furthermore, when applying a low current peak value to the third light-emitting functional layer 13 having low luminous efficiency, the luminance of the third light-emitting functional layer 13 becomes low. Therefore, the reduction in luminance can be compensated for by elongating the light emission time of the third light-emitting functional layer 13 where the luminance is decreased. In addition, the increase of the luminance can be offset by shortening the light emission time of the first light-emitting functional layer where the luminance is increased.

The light-emitting functional layer has a tendency of the luminance itself to become high, although the luminous efficiency is decreased when the current density to be applied becomes high. In one or more embodiments of the present invention, each of the first light-emitting functional layer 11 and the second light-emitting functional layer 12 is driven by a current density higher than that of the third light-emitting functional layer 13. Therefore, according to the ⅓ duty drive of the conventional driving method, the luminance of the third light-emitting functional layer 13 becomes low and the luminance of each of the first light-emitting functional layer 11 and the second light-emitting functional layer 12 becomes high, and thus the color tone of the organic EL element 10 cannot be adjusted to a desired color tone.

Accordingly, as the drive waveform shown in FIG. 5, the light emission time of the first light-emitting functional layer 11 and the second light-emitting functional layer 12 each having a large current density and a high luminance is relatively shortened, and the light emission time of the third light-emitting functional layer 13 having a small current density and a low luminance is relatively lengthened.

For example, in the organic EL element 10, when a white color 1,000 cd/m$^2$ of CIE chromaticity <0.3, 0.3> is displayed, adjustment is carried out so as to apply currents of 120 mA/cm$^2$ to the first light-emitting functional layer 11, of 95 mA/cm$^2$ to the second light-emitting functional layer 12, and of 22 mA/cm$^2$ to the third light-emitting functional layer 13.

In addition, each of lighting rates of the first light-emitting functional layer 11, the second light-emitting functional layer 12, and the third light-emitting functional layer 13 is set to a different time to be applied. Namely, at a frame frequency of 100 Hz, the first light-emitting functional layer 11 is lit for 0.3 msec, the second light-emitting functional layer 12 is lit for 0.5 msec, and the third light-emitting functional layer 13 is lit for 3.3 msec.

As described above, also in case where the current peak value to be applied to each of the light-emitting functional layers is previously determined by the luminous efficiency and characteristics of the lifetime deterioration, it becomes possible to optionally tone the organic EL element by adjusting the lighting rate of each of the light-emitting functional layers.

Thereby, the change of lifetime associated with the luminous efficiency can be compensated for among the respective light-emitting functional layers and the same characteristics of the lifetime deterioration can be obtained among the respective light-emitting functional layers.

Furthermore, it is considered that the characteristics of the lifetime deterioration of the light-emitting functional layer are influenced by changing the lighting rate. For example, since the first light-emitting functional layer has a low lighting rate and a short light emission time, it is also considered that the reduction in luminance is moderated. In this case, it is possible to accelerate the reduction in luminance and to make the characteristics of the lifetime deterioration coincident with one another, by applying a current density in which the luminous efficiency of the first light-emitting functional layer is lower than the luminous efficiency of the third light-emitting functional layer, that is, a current peak value higher than the above current density.

As described above, in addition to the above relation between the luminous efficiency and the characteristics of the lifetime deterioration, the characteristics of the lifetime deterioration of the organic EL element can be improved in consideration of the lighting rate for the toning of the organic EL element.

Therefore, according the method for driving the organic EL element according to one or more embodiments of the present invention, even when the light-emitting functional layers having different luminous efficiencies are formed in the same organic EL element, it is possible to improve the characteristics of the lifetime deterioration and to prevent the change in color tone from the initial chromaticity with the lapse of time. Then, the display quality of the organic EL element can be improved.

Note that, in one or more embodiments of the present invention, although 100 Hz is used as a frame frequency, other frequency may be used. Furthermore, when the organic EL element has elements having considerably different luminous efficiencies, non-lighting time becomes long, and if using a same frame frequency of around 100 Hz, the organic EL element looks like a flicker. Therefore, the frame frequency is as high as, for example, 500 Hz or the like.

Furthermore, in one or more embodiments of the present invention, the duty drive of the organic EL element obtained by laminating three light-emitting functional layers is exemplified, but there is no limitation to the number of the light-emitting functional layers, the ratio of duty, or the like of the organic EL element. The organic EL element to which the above driving method can be applied may not have a laminated configuration, and if the organic EL element may have a configuration in which the current peak value to be applied to each of the light-emitting functional layers and the driving time can be controlled, the organic EL element may not have a laminated configuration, and may have a configuration in which a plurality of the light-emitting functional layers can be simultaneously driven.

Furthermore, in the above explanation, there is explained the method for driving the organic EL element in the case where the light emission areas of the light-emitting functional layers are the same as one another and the luminous efficiencies of the light-emitting functional layers are different from one another, but the configuration of the organic Et element is not limited thereto. For example, the organic EL element can also adopt a configuration of enlarging the area of the light-emitting layer having a lower luminous efficiency than the light-emitting layer having high luminous efficiency. As described above, it is possible to ensure a high luminance even at a smaller current peak value by enlarging the area of the light-emitting layer having low luminous efficiency. In addition, it is possible to prolong the lifetime of the light-emitting layer having low luminous efficiency by driving at a small current peak value.

Also in this case, it is possible to make the characteristics of the lifetime deterioration coincident with each other by making the current peak value to be applied to the light-emitting layer having high luminous efficiency larger than the current peak value to be applied to the light-emitting layer having low luminous efficiency. Namely, there can be simultaneously used the technique to prolong the lifetime by enlarging the area of the light-emitting layer having low luminous efficiency and the technique to make the characteristics of the lifetime deterioration of the light-emitting layer having low luminous efficiency and the light-emitting layer having high luminous efficiency coincident with each other by the driving method according to one or more embodiments of the present invention.

In addition, also in the case where the light emission area is changed, it is possible to reduce the difference of area in comparison with the conventional case, by applying the driving method of the above embodiment. Therefore, the imbalance due to the difference in light emission areas or the difference in the areas of the aperture ratios in the respective light-emitting functional layer can be prevented, visual confirmation of the non-visible area can be suppressed.

Accordingly, it becomes possible to perform display without impairing visibility by applying the driving method according to one or more embodiments of the present invention, also in the method for forming elements in which the light emission areas or the aperture ratios of the organic light-emitting layers having different luminous efficiencies are changed, in forming in parallel each of the light-emitting functional layers by a selective coating method which has been widely adopted in general in the field of the organic EL display, or the like.

Furthermore, a phosphorescent material and a fluorescent material are used as the material, but a phosphorescent material alone or a fluorescent material alone may be used.

For example, also when using only the phosphorescent material, it is possible to make the characteristics of the lifetime deterioration of the respective light-emitting layers coincident with one another, by applying the current peak value corresponding to the luminous efficiency and by controlling the time to be applied, as in the first light-emitting functional layer (G) and the second light-emitting functional layer (R) of the above mentioned embodiment. This also applies to the case where the fluorescent material is used alone, or in other combinations.

Furthermore, one or more embodiments of the present invention are explained without consideration of the characteristics of the lifetime deterioration depending on the material constituting each of the light-emitting functional layers. Also when the characteristics of the lifetime deterioration are different depending on the material to be used, as in one or more embodiments of the present invention, it is possible to make the characteristics of the lifetime deterioration coincident with one another, by applying a low current peak value to the material luminance and by applying a high current peak value to the material having a small reduction in luminance. In addition, it becomes possible to optionally perform toning by controlling the applied time to each of the light-emitting functional layers.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

10 Organic EL element
11 First light-emitting functional layer
12 Second light-emitting functional layer
13 Third light-emitting functional layer
14 First electrode
15 Second electrode
15 Third electrode
16 Third electrode
17 Fourth electrode
19 Substrate

The invention claimed is:

1. A method for driving an organic electroluminescent element comprising a first light-emitting layer and a second light-emitting layer, comprising:
   applying a first current peak value to the first light-emitting layer;
   applying a second current peak value to the second light-emitting layer that exhibits a lower luminous efficiency than the first light-emitting layer at a current density of the second current peak value; and
   wherein the first current peak value has a higher current density than the second current peak value, and
   wherein an application time of the first current peak value is shorter than an application time of the second current peak value.

2. The method for driving the organic electroluminescent element according to claim 1,
   wherein the current density of the second current peak value is smaller than a current density in which luminous efficiencies of the first light-emitting layer and the second light-emitting layer coincide with each other.

3. The method for driving the organic electroluminescent element according to claim 1,
   wherein the current density of the first current peak value is not less than a current density in which luminous efficiency is the same as luminous efficiency of the second light-emitting layer at the second current peak value.

4. The method for driving the organic electroluminescent element according to claim 1,
   wherein the first light-emitting layer and the second light-emitting layer have the same light-emitting area.

5. The method for driving the organic electroluminescent element according to claim 1,
   wherein the first light-emitting layer and the second light-emitting layer are laminated.

6. The method for driving the organic electroluminescent element according to claim 1,
   wherein the current density of the second current peak value is smaller than a current density in which luminous efficiencies of the first light-emitting layer and the second light-emitting layer coincide with each other.

7. The method for driving the organic electroluminescent element according to claim 1,
   wherein the current density of the first current peak value is not less than a current density in which luminous efficiency is a same as luminous efficiency of the second light-emitting layer at the second current peak value.

* * * * *